(12) United States Patent
Kim

(10) Patent No.: US 10,546,618 B2
(45) Date of Patent: Jan. 28, 2020

(54) NONVOLATILE MEMORY DEVICE, DATA STORAGE DEVICE INCLUDING THE SAME AND OPERATING METHOD THEREOF

(71) Applicant: SK hynix Inc., Gyeonggi-do (KR)

(72) Inventor: Do Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/958,912

(22) Filed: Apr. 20, 2018

(65) Prior Publication Data

US 2019/0088293 A1 Mar. 21, 2019

(30) Foreign Application Priority Data

Sep. 19, 2017 (KR) .................. 10-2017-0120623

(51) Int. Cl.
*G11C 7/10* (2006.01)
*G11C 16/26* (2006.01)
*G11C 16/08* (2006.01)
*G06F 12/02* (2006.01)

(52) U.S. Cl.
CPC ........ *G11C 7/1006* (2013.01); *G06F 12/0246* (2013.01); *G11C 16/08* (2013.01); *G11C 16/26* (2013.01)

(58) Field of Classification Search
CPC ....... G11C 7/1006; G11C 16/08; G11C 16/26; G11C 29/44; G06F 12/0246
See application file for complete search history.

(56) References Cited

U.S. PATENT DOCUMENTS

2016/0329084 A1* 11/2016 Han .................. G11C 29/1201
2018/0373584 A1* 12/2018 Huang ................ G06F 11/1072

FOREIGN PATENT DOCUMENTS

KR 1020170027654 3/2017

* cited by examiner

*Primary Examiner* — Tri M Hoang
(74) *Attorney, Agent, or Firm* — IP & T Group LLP

(57) ABSTRACT

A nonvolatile memory device includes a plurality of memory cells; a buffer suitable for storing data to be written in a page of memory cells; a fail bit counter suitable for counting fail bits among the data stored in the buffer; and a state determination unit suitable for determining a reliability of the page, based on a counted number of fail bits.

19 Claims, 9 Drawing Sheets

FIG.3A

| Setting | Meaning | Description |
|---|---|---|
| 00 00 | Divide by 1 | Set chunk unit by dividing page size by 1 |
| 00 01 | Divide by 2 | Set chunk unit by dividing page size by 2 |
| 00 10 | Divide by 4 | Set chunk unit by dividing page size by 4 |
| 00 11 | Divide by 8 | Set chunk unit by dividing page size by 8 |
| 01 00 | Divide by 16 | Set chunk unit by dividing page size by 16 |
| 01 01 | Divide by 32 | Set chunk unit by dividing page size by 32 |

FIG.3B

| Setting | Meaning | Description |
|---|---|---|
| 00 00 | 10 bit | Define the number of fail bits as reliability threshold to 10 |
| 00 01 | 20 bit | Define the number of fail bits as reliability threshold to 20 |
| 00 10 | 30 bit | Define the number of fail bits as reliability threshold to 30 |
| 00 11 | 40 bit | Define the number of fail bits as reliability threshold to 40 |
| 01 00 | 50 bit | Define the number of fail bits as reliability threshold to 50 |
| 01 01 | 60 bit | Define the number of fail bits as reliability threshold to 60 |

FIG.3C

| Setting | Description |
|---|---|
| 00 | Fail bit does not exist (N) |
| 01 | The number of fail bits is smaller than reliability threshold (L) |
| 10 | The number of fail bits is equal to or larger than reliability threshold (H) |

# NONVOLATILE MEMORY DEVICE, DATA STORAGE DEVICE INCLUDING THE SAME AND OPERATING METHOD THEREOF

CROSS-REFERENCES TO RELATED APPLICATION

The present application claims priority to Korean application number 10-2017-0120623, filed on Sep. 19, 2017, which is incorporated herein by reference in its entirety.

BACKGROUND

1. Technical Field

Various embodiments generally relate to a data storage device. Particularly, various embodiments of the present disclosure relate to a data storage device including a nonvolatile memory device.

2. Related Art

A data storage device may be configured to store the data provided from an external device, in response to a write request from the external device. Also, the data storage device may be configured to provide stored data to the external device, in response to a read request from the external device. The external device as an electronic device capable of processing data may include a computer, a digital camera or a mobile phone. The data storage device may operate by being built in the external device, or may operate by being manufactured separately and being coupled to the external device.

A data storage device using a memory device provides advantages in that, since there is no mechanical driving part, stability and durability are excellent, an information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments are directed to a nonvolatile memory device that efficiently determines the reliability state of a page when performing a write operation for data, a data storage device and an operating method thereof.

In an embodiment, a nonvolatile memory device may include: a plurality of memory cells; a buffer suitable for storing data to be written in a page of memory cells; a fail bit counter suitable for counting fail bits among the data stored in the buffer; and a state determination unit suitable for determining a reliability of the page, based on a counted number of fail bits.

In an embodiment, a data storage device may include: a nonvolatile memory device including a plurality of memory cells; and a controller suitable for outputting a write command for data to be written in a page of first memory cells, to the nonvolatile memory device, wherein the nonvolatile memory device performs a write operation and a reliability determination operation to the page, in response to the write command, and transmits a reliability of the page to the controller, and wherein the controller outputs a write command such that the data are written in a page of second memory cells, when the reliability is equal to or larger than reference reliability threshold.

In an embodiment, a method for operating a data storage device may include: outputting a first write command by a controller; determining a reliability of a page written with data, in response to the first write command, by a nonvolatile memory device; and determining a page to be written with the data, based on the reliability, by the controller.

A data storage device may include: a plurality of first level storage units each including one or more second level storage units; a reliability unit suitable for determining reliability of a selected one among the second level storage units based on a number of write-failed bits of the selected second level storage unit; and a controller suitable for controlling the first level storage units based on a result of the determination such that data corresponding to the write-failed bits is written in any other first level storage unit than a corresponding first level storage unit of the selected second level storage unit.

A method of operating a data storage device including a plurality of first level storage units each including one or more second level storage units, the method may include: determining reliability of a selected one among the second level storage units based on a number of write-failed bits of the selected second level storage unit; and writing data corresponding to the write-failed bits in any other first level storage unit than a corresponding first level storage unit of the selected second level storage unit based on a result of the determination.

According to the embodiments, the reliability state of a page may be efficiently determined by determining fail bits when data is written. The reliability state of a page may be more efficiently determined by determining the number of fail bits in each chunk of each page.

BRIEF DESCRIPTION OF THE DRAWINGS

FIG. 3A is a table describing settings for the unit of a chunk by which fail bits are to be counted, FIG. 3B is a table describing settings for the number of fail bits as a state determination reference by chunk, and FIG. 3C is a table describing settings for determining a reliability in a state information determination unit.

DETAILED DESCRIPTION

Figure 1:
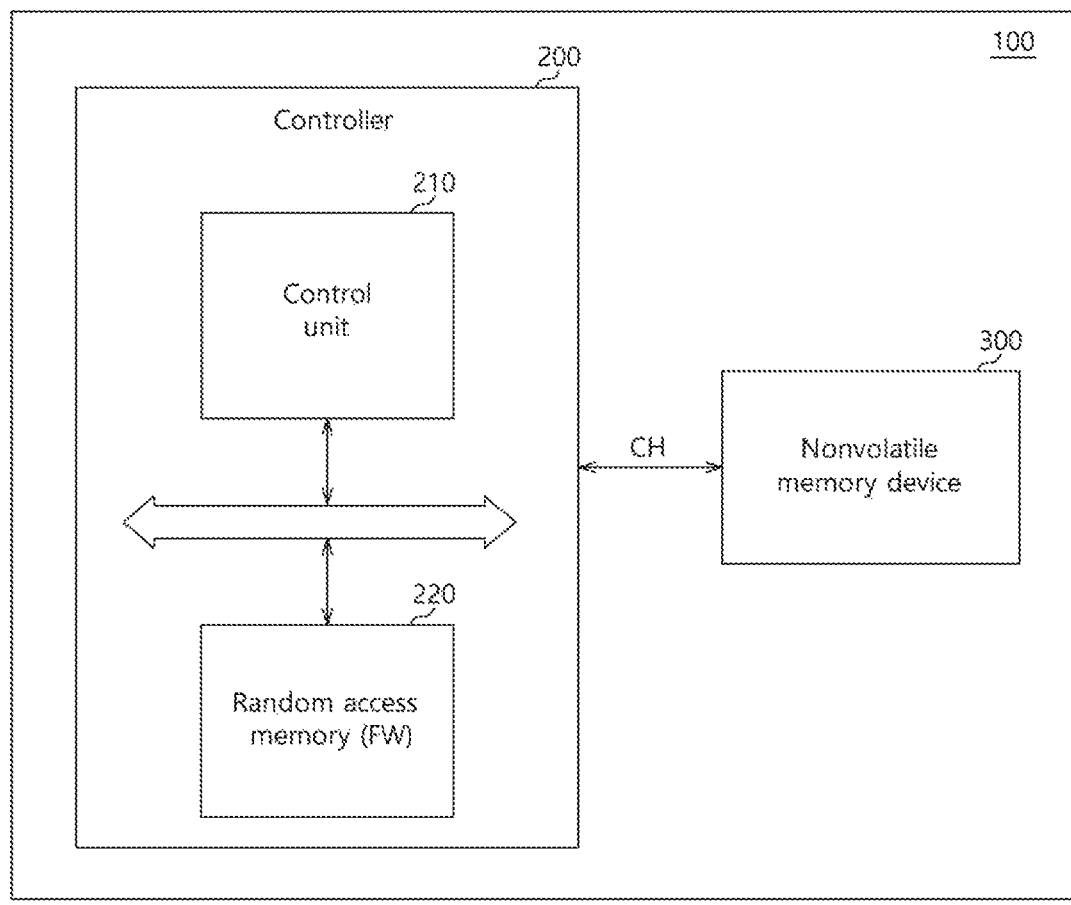
FIG. 1 is a block diagram illustrating an example of a data storage device in accordance with an embodiment of the present disclosure.

In the present invention, advantages, features, and methods for achieving the present invention will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes " and/or "including," when used in this specification, specify the presence of at least one stated feature, step, operation, and/or element, but do not preclude the presence or addition of one or more other features, steps, operations, and/or elements thereof.

Hereinafter, a nonvolatile memory device, a data storage device including the same and an operating method thereof will be described below with reference to the accompanying drawings through various examples of embodiments.

Figure 2:
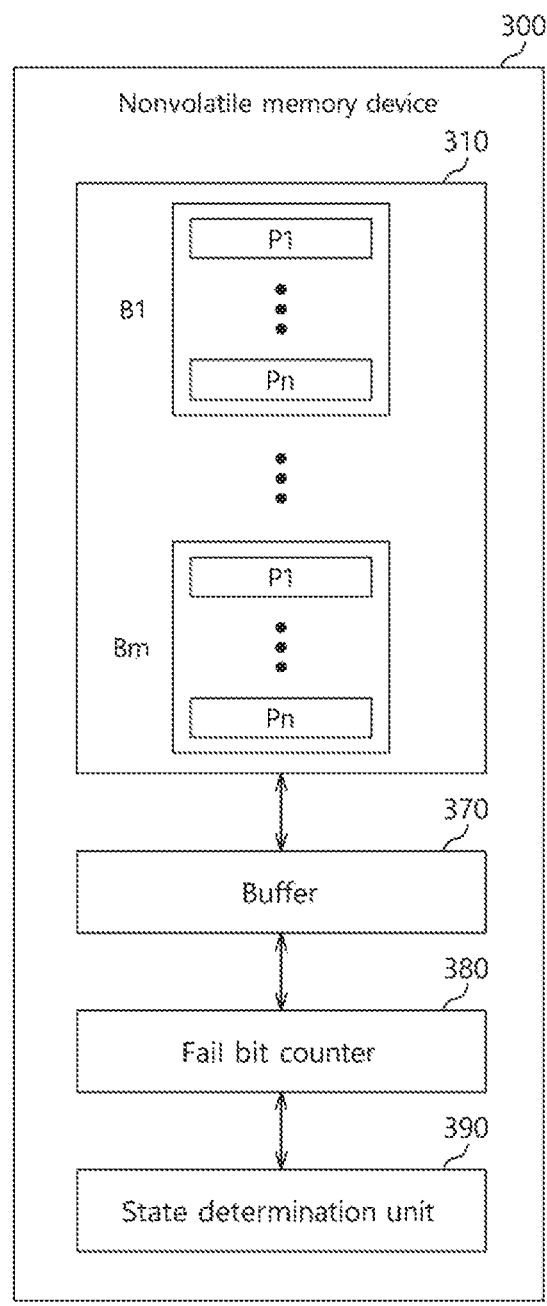
FIG. 2 is a block diagram illustrating an example of a nonvolatile memory device shown in FIG. 1.

FIG. 1 is a block diagram illustrating an example of a data storage device in accordance with an embodiment of the present disclosure. FIG. 2 is a block diagram illustrating an example of a nonvolatile memory device shown in FIG. 1.

Referring to FIGS. 1 and 2, a data storage device 100 may store data provided from an external device, in response to a write request from the external device. Also, the data storage device 100 may provide stored data to the external device, in response to a read request from the external device.

The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may be referred to as a memory system.

The data storage device 100 may be manufactured as any one of various kinds of storage devices according to a host interface meaning a transmission protocol with respect to the host device. For example, the data storage device 100 may be any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various kinds of package types. For example, the data storage device 100 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP), and a wafer-level stack package (WSP).

The data storage device 100 may include a controller 200 and a nonvolatile memory device 300. The controller 200 may include a control unit 210 and a random access memory 220.

The control unit 210 may be configured by a micro control unit (MCU) or a central processing unit (CPU). The control unit 210 may process a request which is transmitted from the host device. In order to process the request, the control unit 210 may drive an instruction or algorithm of a code type, that is, a firmware FW, loaded in the random access memory 220, and may control internal function blocks and a nonvolatile memory device 300.

The random access memory 220 may be configured by a random access memory such as a dynamic random access memory (DRAM) or a static random access memory (SRAM). The random access memory 220 may store the firmware FW, which is to be driven by the control unit 210. Also, the random access memory 220 may store data necessary for driving the firmware FW, for example, metadata. That is to say, the random access memory 220 may operate as the working memory of the control unit 210.

Referring to FIGS. 1 and 2, the nonvolatile memory device 300 may include a memory cell region 310. The memory cell region 310 may include a plurality of memory blocks B1 to Bm, and each of the memory blocks B1 to Bm may include a plurality of pages P1 to Pn. From an operational viewpoint or a physical (or structural) viewpoint, the memory cells included in the memory cell region 310 may be a hierarchical memory cell set or memory cell unit. For example, memory cells which are coupled to the same word line and are to be read and written (or programmed) simultaneously may be configured as a page P. In the following descriptions, for the sake of convenience in explanation, memory cells configured as a page P will be referred to as a "page." Also, memory cells to be erased simultaneously may be configured as a memory block B.

The nonvolatile memory device 300 in accordance with the embodiment of the present disclosure may also include a buffer 370 that may store data to be written in a page of memory cells, a fail bit counter 380 that may count fail bits among the data stored in the buffer 370, and a state determination unit 390 that may determine the reliability of the page based on the counted number of fail bits.

The data storage device 100 may to store data provided from the external device, in response to a write request from the external device. In this regard, a write command from the controller 200 may be transmitted to the nonvolatile memory device 300, and data to be written may be temporarily stored in the buffer 370 and be then written in a page to write. The buffer 370 may be disposed in the nonvolatile memory device 300.

Meanwhile, an erased memory cell may store, for example, "1." Therefore, among the data temporarily stored in the buffer 370, "1" may not be actually written in a memory cell. A memory cell to be written with "1" may be substantially prohibited from being written and may retain the current state.

Conversely, among the data temporarily stored in the buffer 370, "0" may be actually written in a memory cell. A memory cell to be written with "0" may be applied with a write voltage at least one time to store "0." If the corresponding memory cell stores "0," "0" stored in the buffer 370 may be changed to "1" such that the write voltage is not applied any more to the memory cell. If the corresponding memory cell does not store "0" until a write operation is ended, for example, until the write voltage is applied a predetermined number of times, the write operation to the corresponding memory cell may fail and the buffer 370 may retain "0." Thus, in the present embodiment, even after the write operation is ended, a bit still having a value of "0" among bits stored in the buffer 370 may be defined as a fail bit.

FIG. 3A is a table describing settings for the unit of a chunk by which fail bits are to be counted, FIG. 3B is a table describing settings for the number of fail bits as a state determination reference by chunk, and FIG. 3C is a table describing settings for determining reliability in the state determination unit 390.

Referring to FIGS. 3A to 3C, the fail bit counter 380 in accordance with the embodiment of the present disclosure may count fail bits by the unit of a chunk, and the state determination unit 390 may determine the reliability of each of the chunks included in a page, based on the counted number of fail bits. Also, a reliability threshold may be set according to the control of the external device. The reliability threshold may be set or changed in advance.

As shown in FIG. 3A, the unit of a chunk as a target of the counting the fail bits may be optionally set to correspond to the unit of a chunk as a target of an ECC engine in the controller 200. When fail bits are counted by the unit of a chunk, the numbers of fail bits of respective chunks may be identified in a detailed manner and concentration of the fail bits to a specific chunk in a page may be quickly identified, by which the reliability of the page may be improved.

Referring to FIG. 3B, a threshold number of fail bits for determining the reliability of each chunk, that is, the reliability threshold for each chunk, may be set in the controller 200. The reliability threshold may be transmitted to the nonvolatile memory device 300, and accordingly, reliability may be determined by the reliability threshold and the counted number of fail bits in the nonvolatile memory device 300.

Referring to FIG. 3C, reliability to be determined may be set in the state determination unit 390. Based on the above-described reliability threshold, determination may be made by being divided into a case where a counted fail bit does not exist (N), a case where the counted number of fail bits is smaller than the reliability threshold (L), and a case where the counted number of fail bits is equal to or larger than the reliability threshold (H).

The setting values shown in FIGS. 3A to 3C are mere examples, and the present invention is not limited thereto, meaning, the setting values may be changed at any time.

Further, the state determination unit 390 in accordance with the embodiment of the present disclosure may determine and output not only the reliability information, but also whether a page is erased or not, that is, whether a page stores data or not.

Referring again to FIG. 2, the data storage device 100 in accordance with the embodiment of the present disclosure may include the nonvolatile memory device 300, which includes the plurality of memory cells and the controller 200 that may output a write command for data to be written in a target page of first memory cells, to the nonvolatile memory device 300. The nonvolatile memory device 300 may perform a write operation and reliability determination operation in response to the write command, and may transmit the reliability of the target page to the controller 200. When the counted number of fail bits in the target page is equal to or larger than the reliability threshold, the controller 200 may output a write command such that the data is written in a page of second memory cells.

Also, as mentioned above in the explanations for the nonvolatile memory device 300, the nonvolatile memory device 300 in accordance with the embodiment of the present disclosure may include the buffer 370 that may store data, may count fail bits among the data stored in the buffer 370 after performing the write operation, and may determine the reliability of the page based on the counted number of fail bits. Moreover, the nonvolatile memory device 300 in accordance with the embodiment of the present disclosure may count fail bits by the unit of a chunk, and may determine the reliability of each of the chunks included in the page, based on the counted number of fail bits.

As described above, the data storage device 100 in accordance with the embodiment of the present disclosure may count the number of fail bits by the unit of a chunk and determine reliability of the chunk. When counting the number of fail bits by the unit of a chunk, the controller 200 may transmit an address corresponding to a selected chunk to the nonvolatile memory device 300, and receive the reliability of the selected chunk. The nonvolatile memory device 300 may provide the determined reliabilities of a plurality of selected chunks to the controller 200 on a first-come-first-serve basis, and thus the controller 200 identifies the determined reliabilities of the plurality of selected chunks. For example, if a result value of reliability is 8 bytes, the first byte may be a value corresponding to the leftmost chunk of the page, and the eighth byte may be a value corresponding to the rightmost chunk of the page. However, it is to be noted that the embodiment is not limited thereto and the setting may be changed.

The data storage device 100 in accordance with the embodiment of the present disclosure may count the number of fail bits by the unit of a page and determine reliabilities of the chunks included in the selected page. When counting the number of fail bits by the unit of a page, the controller 200 may transmit an address corresponding to a selected page or an address corresponding to a first (e.g., the leftmost or rightmost) chunk of the selected page to the nonvolatile memory device 300, and receive the reliabilities of the chunks of the selected page. The nonvolatile memory device 300 provides the determined reliabilities of chunks included in the selected page by a sequence of the chunks in the selected page, and thus the controller 200 identifies the determined reliabilities of the respective chunks of the selected page.

Figure 4:
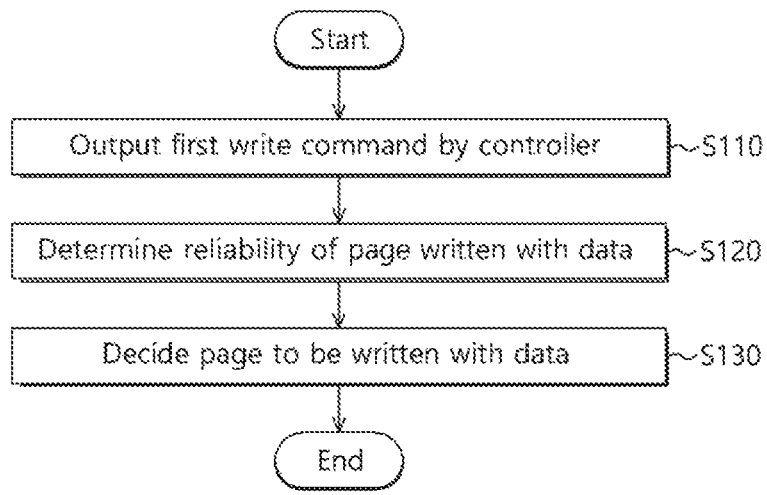
FIGS. 4 and 5 are flow charts describing a method of operating a data storage device in accordance with an embodiment of the present disclosure.
Figure 5:
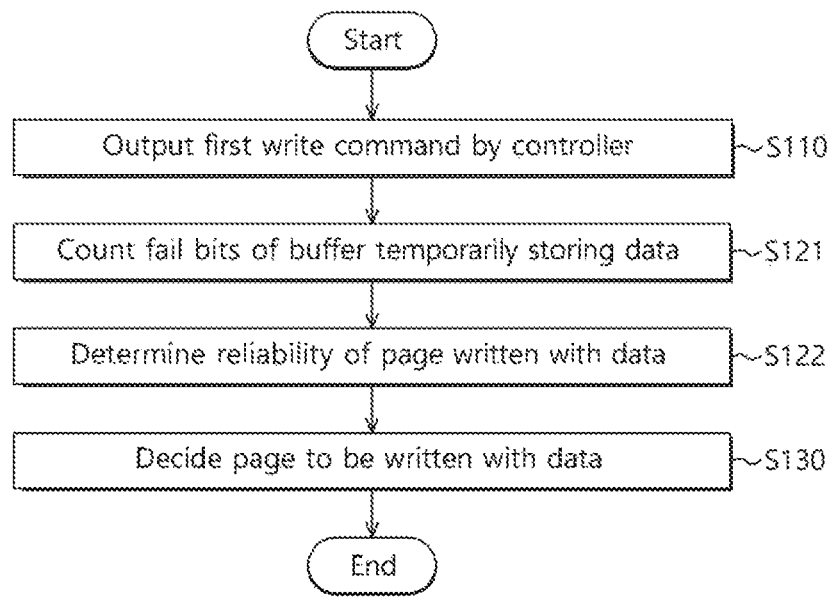

FIGS. 4 and 5 are flow charts describing a method of operating a data storage device in accordance with an embodiment of the present disclosure.

Referring to FIGS. 4 and 5, a method of operating a data storage device in accordance with an embodiment of the present disclosure may include step S110 of outputting, by a controller, a first write command; step S120 of determining, by a nonvolatile memory device, the reliability of a page written with data in response to the first write command; step S130 of determining, by the controller, a page to be written with the data based on the reliability. The step S120 of determining the reliability may include step S121 of counting fail bits in a buffer in which the data are temporarily stored and step S122 of determining the reliability based on the counted number of fail bits.

In the method of operating a data storage device in accordance with the embodiment of the present disclosure, the step S130 of determining a page to be written with the data may output a second write command such that the data are written in a page other than the determined page, when the counted number of fail bits in the determined page is equal to or larger than a reliability threshold, and may retain the data written in the determined page, when the counted number of fail bits in of the determined page is smaller than the reliability threshold. Also, the step S121 of counting fail bits may include step of counting fail bits by the unit of a chunk (not shown), and the step S122 of determining the reliability may determine the reliability of the chunk based on the counted number of fail bits. Moreover, the reliability threshold may be set or changed in advance in the same manner as in the above-described nonvolatile memory device.

Figure 6:
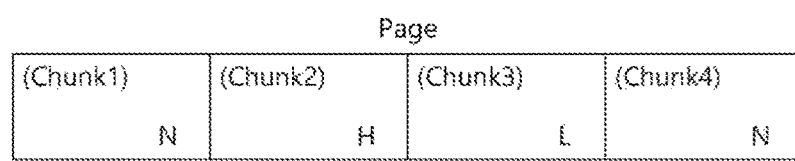
FIG. 6 is a diagram illustrating an example of results of determining a reliability by chunk.

FIG. 6 is a diagram illustrating an example of results of determining reliability by chunk.

In the method of operating a data storage device in accordance with the embodiment of the present disclosure, the step S122 of determining the reliability may determine, when the counted number of fail bits in even any one of one or more chunks included in the page is equal to or larger than the reliability threshold, that the counted number of fail bits of the page including the chunk, of which counted number of fail bits is equal to or larger than the reliability threshold, is equal to or larger than the reliability threshold.

Referring to FIG. 6, it is assumed that one page may be divided into four chunks. If, as shown in FIG. 6, only one chunk (e.g., a second chunk from the left) among the four chunks included in a target page of a write operation has fail bits with a number equal to or larger than the reliability threshold, even though each of the remaining three chunks has fail bits with a number smaller than the reliability threshold, it may be determined that the target page has a number of fail bits equal to or larger than the reliability threshold. As this determination information is transmitted to the controller 200, the controller 200 may output again a write command such that data, which are to be written into the target page, are written in a new page other than the target page. In this case, the above-described reliability determination operation may be performed again for the chunks of the new page.

The method of operating a data storage device 100 in accordance with the embodiment of the present disclosure may also include a step of transmitting an address corresponding to a chunk for which reliability determination is required, to the nonvolatile memory device 300 by the controller 200.

Figure 7:
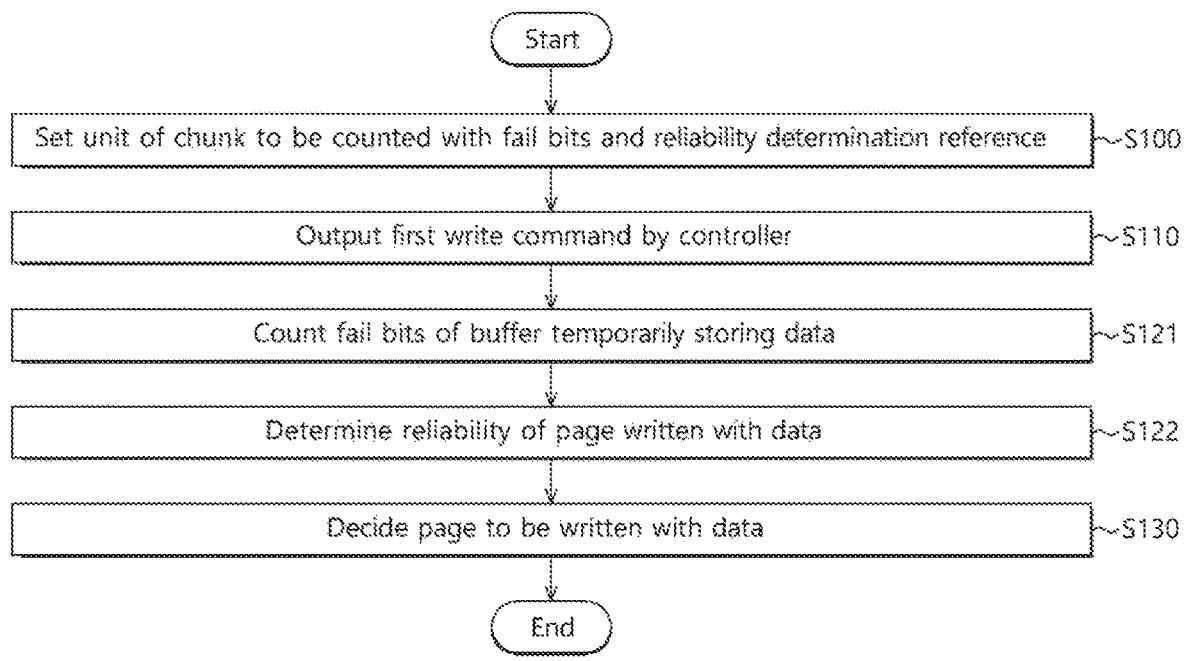
FIG. 7 is a flow chart describing a method of operating a data storage device in accordance with another embodiment of the present disclosure.

FIG. 7 is a flow chart describing a method of operating a data storage device in accordance with another embodiment of the present disclosure.

Referring to FIG. 7, a method of operating a data storage device may include step S100 of setting, by a controller, the unit of a chunk in which fail bits are to be counted in the nonvolatile memory device or step S100 of setting, by the controller, the reliability threshold, as well as steps S116 to S130 described with reference to FIG. 5. The unit of a chunk in which fail bits are to be counted or the reliability threshold may be set or changed in advance.

Figure 8:
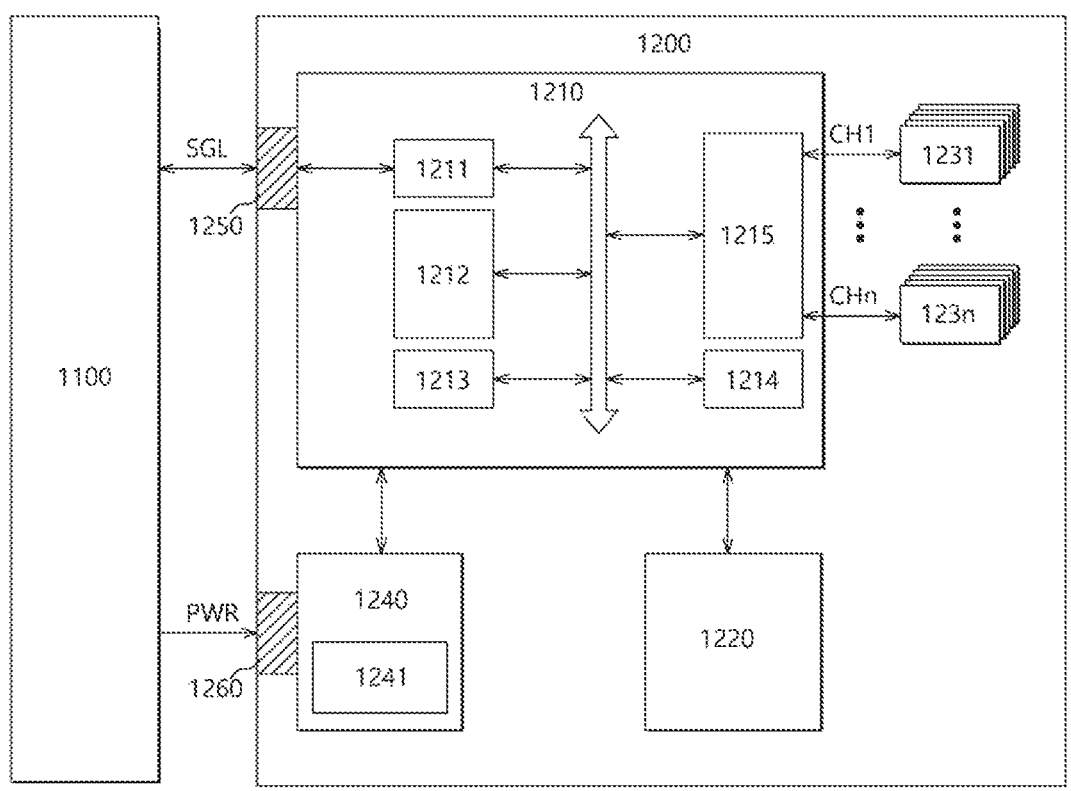
FIG. 8 is a diagram illustrating an example of a data processing system including a solid state drive in accordance with an embodiment of the present disclosure.

FIG. 8 is a diagram illustrating an example of a data processing system including a solid state drive (SSD) in accordance with an embodiment of the present disclosure. Referring to FIG. 8, a data processing system 1000 may include a host device 1100 and a solid state drive (SSD) 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E), and universal flash storage (UFS).

The control unit 1212 may analyze and process the signal SGL inputted from the host device 1100. The control unit 1212 may control operations of internal function blocks according to a firmware or a software for driving the SSD 1200. The random access memory 1213 may be used as a working memory for driving such a firmware or software.

The error correction code (ECC) unit 1214 may generate the parity data of data to be transmitted to the nonvolatile memory devices 1231 to 123n. The generated parity data may be stored together with the data in the nonvolatile memory devices 1231 to 123n. The error correction code (ECC) unit 1214 may detect an error of the data read out from the nonvolatile memory devices 1231 to 123n, based on the parity data. If a detected error is within a correctable range, the error correction code (ECC) unit 1214 may correct the detected error.

The memory interface unit 1215 may provide control signals such as commands and addresses to the nonvolatile memory devices 1231 to 123n, according to control of the control unit 1212. Moreover, the memory interface unit 1215 may exchange data with the nonvolatile memory devices 1231 to 123n, according to control of the control unit 1212. For example, the memory interface unit 1215 may provide the data stored in the buffer memory device 1220, to the nonvolatile memory devices 1231 to 123n, or provide the data read out from the nonvolatile memory devices 1231 to 123n, to the buffer memory device 1220.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 9:
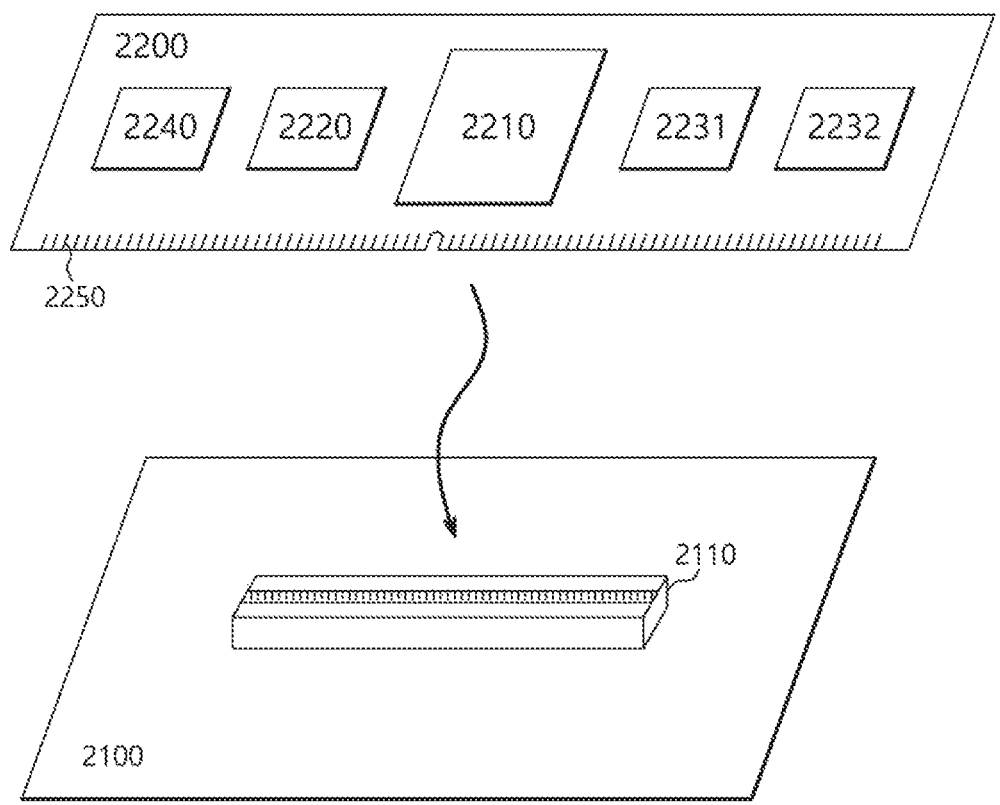
FIG. 9 is a diagram illustrating an example of a data processing system including a data storage device in accordance with an embodiment of the present disclosure.

FIG. 9 is a diagram illustrating an example of a data processing system including a data storage device in accordance with an embodiment of the present disclosure. Referring to FIG. 9, a data processing system 2000 may include a host device 2100 and a data storage device 2200.

The host device 2100 may be configured in the form of a board such as a printed circuit board (PCB). Although not shown, the host device 2100 may include internal function blocks for performing the function of a host device.

The host device 2100 may include a connection terminal 2110 such as a socket, a slot, or a connector. The data storage device 2200 may be mounted to the connection terminal 2110.

The data storage device 2200 may be configured in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 8.

The buffer memory device 2220 may temporarily store data to be stored in the nonvolatile memory devices 2231 and 2232. Further, the buffer memory device 2220 may temporarily store the data read out from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be configured into various types depending on an interface scheme between the host device 2100 and the data storage device 2200. The connection terminal 2250 may be disposed on any one side of the data storage device 2200.

Figure 10:
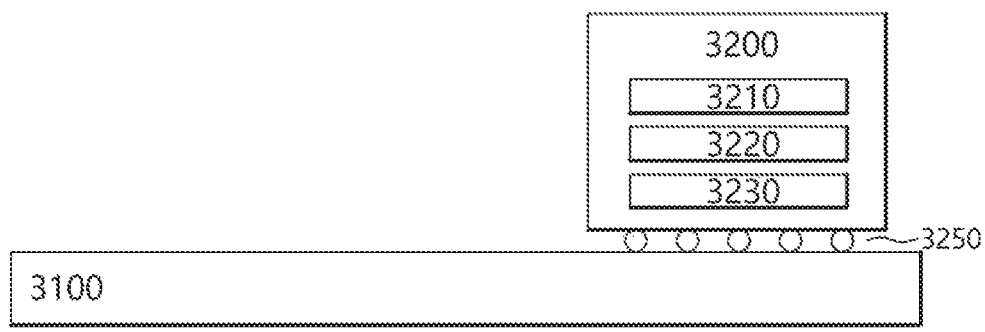
FIG. 10 is a diagram illustrating an example of a data processing system including a data storage device in accordance with an embodiment of the present disclosure.

FIG. 10 is a diagram illustrating an example of a data processing system including a data storage device in accordance with an embodiment of the present disclosure. Referring to FIG. 10, a data processing system 3000 may include a host device 3100 and a data storage device 3200.

The host device 3100 may be configured in the form of a board such as a printed circuit board. Although not shown, the host device 3100 may include internal function blocks for performing the function of a host device.

The data storage device 3200 may be configured in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 8.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the data storage device 3200.

Figure 11:
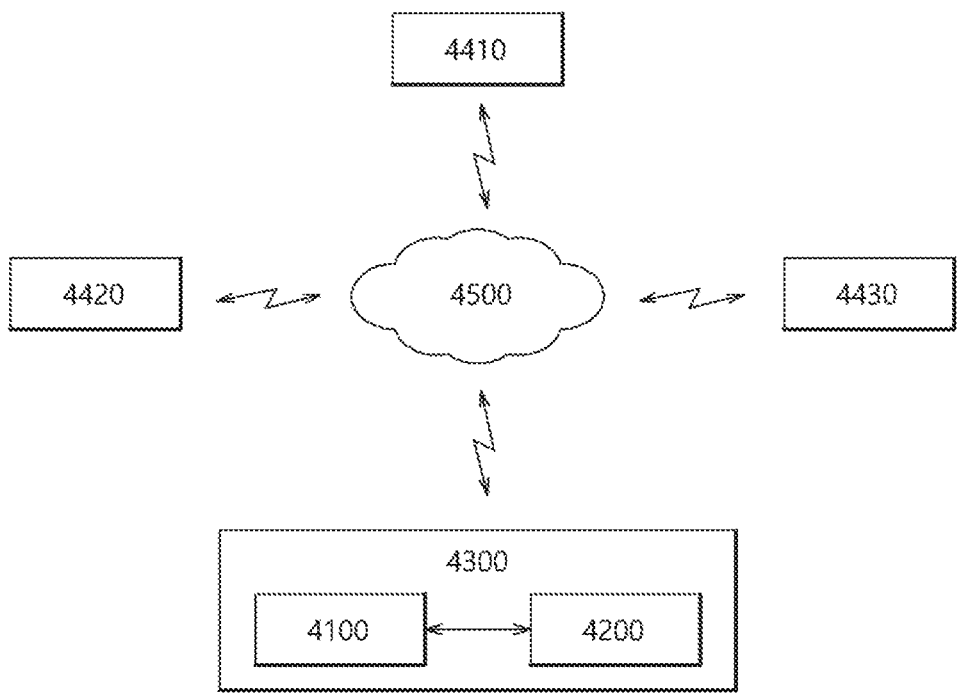
FIG. 11 is a diagram illustrating a representation of an example of a network system including a data storage device in accordance with an embodiment of the present disclosure.

FIG. 11 is a diagram illustrating an example of a network system including a data storage device in accordance with an embodiment of the present disclosure. Referring to FIG. 11, a network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and a data storage device 4200. The data storage device 4200 may be configured by the data storage device 100 shown in FIG. 1, the data storage device 1200 shown in FIG. 8, the data storage device 2200 shown in FIG. 9 or the data storage device 3200 shown in FIG. 10.

Figure 12:
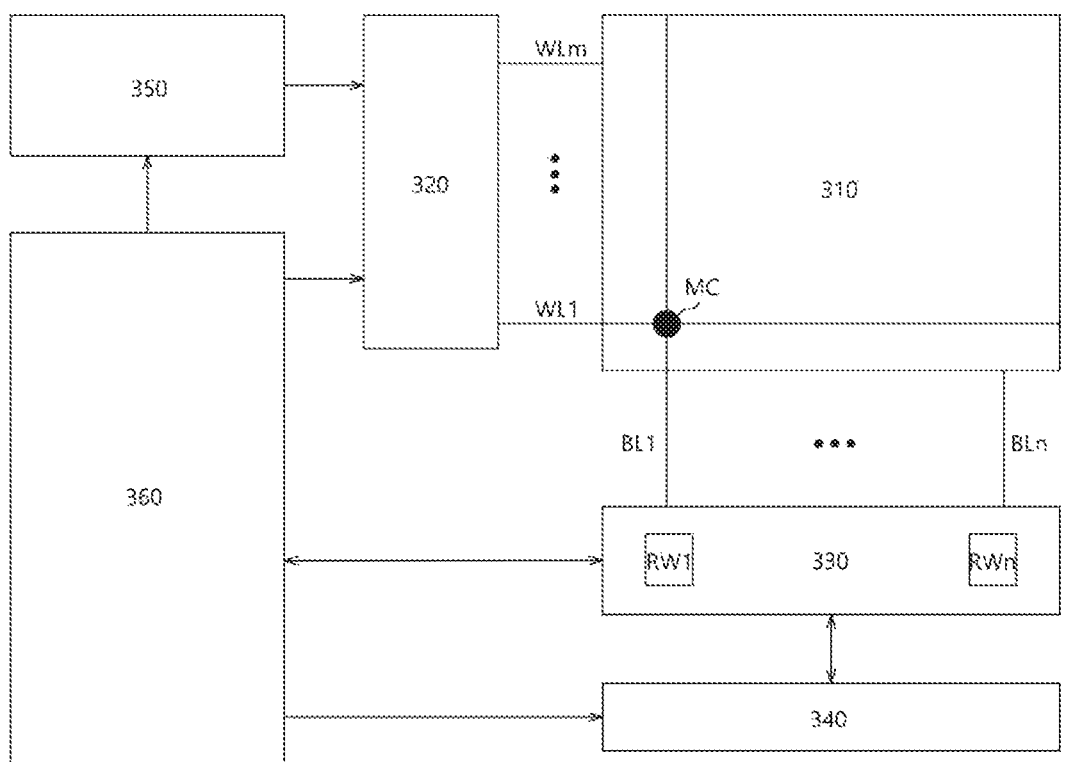
FIG. 12 is a block diagram illustrating a representation of an example of a nonvolatile memory device included in a data storage device in accordance with an embodiment of the present disclosure.

FIG. 12 is a block diagram illustrating an example of a nonvolatile memory device included in a data storage device in accordance with an embodiment of the present disclosure. Referring to FIG. 12, a nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

The descriptions for the above-described device may be applied to the methods in accordance with the embodiments of the present disclosure. Therefore, descriptions the same as the descriptions for the above-described device were omitted in the methods.

While various embodiments have been described above, it will be understood to those skilled in the art that the embodiments described are examples only. Accordingly, the nonvolatile memory device, the data storage device including the same and the operating method thereof described herein should not be limited based on the described embodiments.

What is claimed is:

1. A nonvolatile memory device comprising:
a plurality of memory cells;
a buffer suitable for storing data to be written in a page of memory cells;
a fail bit counter suitable for counting fail bits among the data stored in the buffer; and a state determination unit suitable for determining a reliability of the page, based on a counted number of fail bits,
wherein the fail bit counter counts fail bits by a unit of a chunk as a target of an Error Correction Code (ECC) engine in a controller, and
wherein the unit of the chunk is determined by one of a plurality of settings, each setting of the plurality of settings corresponding to a different size unit of a chunk.

2. The nonvolatile memory device according to claim 1, wherein the fail bits are bits which remain as a predetermined value, among the data stored in the buffer, after a write operation is performed for the page.

3. The nonvolatile memory device according to claim 1, wherein the state determination unit determines a reliability of each of chunks included in the page, based on a counted number of fail bits.

4. The nonvolatile memory device according to claim 1, wherein the state determination unit sets a reliability threshold for determining the reliability of the page according to control of an external device.

5. A data storage device comprising:
a nonvolatile memory device including a plurality of memory cells; and
a controller suitable for outputting a write command for data to be written in a page of first memory cells, to the nonvolatile memory device,
wherein the nonvolatile memory device performs a write operation and a reliability determination operation to the page in response to the write command, and transmits a reliability of the page of the first memory cells to the controller, and
wherein the controller outputs the write command such that the data are written in a page of the first memory cells, when the reliability of the page is equal to or larger than a reliability threshold,
wherein the nonvolatile memory device further counts fail bits by a unit of a chunk among the data stored in the buffer after performing the write operation, and determines the reliability of the page of the first memory cells based on a counted number of fail bits, and
wherein the unit of the chunk is determined by one of a plurality of settings, each setting of the plurality of settings corresponding to a different size unit of a chunk.

6. The data storage device according to claim 5, wherein the nonvolatile memory device further includes the buffer suitable for storing the data.

7. The data storage device according to claim 5, wherein the fail bits are bits which remain as a predetermined value, among the data stored in the buffer, after a write operation is performed for the page.

8. The data storage device according to claim 5, wherein the nonvolatile memory device counts fail bits by the unit of a chunk, and determines a reliability of each of chunks included in the page, based on a counted number of fail bits.

9. The data storage device according to claim 8, wherein the controller transmits an address corresponding to a selected chunk to the nonvolatile memory device, and receives a reliability of the selected chunk.

10. The data storage device according to claim 8, wherein the controller sets the unit of a chunk in the nonvolatile memory device.

11. The data storage device according to claim 8, wherein the controller sets a reliability threshold for determining the reliability of the page, in the nonvolatile memory device.

12. A method for operating a data storage device, comprising:
outputting a first write command by a controller;
determining a reliability of a page written with data, in response to the first write command, by a nonvolatile memory device;

determining a page to be written with the data, based on the reliability of the page, by the controller;

counting fail bits in a buffer in which the data are temporarily stored; and determining the reliability of the page based on a counted number of fail bits by a unit of a chunk, wherein the unit of the chunk is determined by one of a plurality of settings, each setting of the plurality of settings corresponding to a different size unit of a chunk.

13. The method according to claim 12, wherein the fail bits are bits which remain as a predetermined value, among the data stored in the buffer, after a write operation is performed.

14. The method according to claim 12, further comprising:

setting a reliability threshold for determining the reliability of the page in the nonvolatile memory device, by the controller.

15. The method according to claim 12, wherein the determining of a page to be written with the data outputs a second write command such that the data are written in a page other than the determined page, when the reliability of the determined page is equal to or larger than a reliability threshold, and retains the data written in the determined page, when the reliability of the determined page is smaller than the reliability threshold.

16. The method according to claim 12, wherein the counting of fail bits comprises counting fail bits by the unit of a chunk, and wherein the determining of the reliability of the page comprises determining reliability of each of chunks based on a counted number of fail bits.

17. The method according to claim 16, further comprising:

setting a reliability threshold for determining the reliability of the page in the nonvolatile memory device, by the controller.

18. The method according to claim 16, wherein the determining of the reliability of the page includes determining that the reliability of the page is equal to or larger than the reliability threshold, when a reliability of at least one chunk among chunks included in the page is equal to or larger than a reliability threshold.

19. The method according to claim 16, further comprising transmitting an address corresponding to a chunk for which the reliability of the page determination is required, to the nonvolatile memory device, by the controller.

* * * * *